United States Patent
Huang et al.

(10) Patent No.: US 12,068,755 B2
(45) Date of Patent: Aug. 20, 2024

(54) DIGITAL SLOPE ANALOG TO DIGITAL CONVERTER AND SIGNAL CONVERSION METHOD

(71) Applicant: REALTEK SEMICONDUCTOR CORPORATION, Hsinchu (TW)

(72) Inventors: Shih-Hsiung Huang, Hsinchu (TW); Wei-Cian Hong, Hsinchu (TW); Sheng-Yen Shih, Hsinchu (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 181 days.

(21) Appl. No.: 17/944,340

(22) Filed: Sep. 14, 2022

(65) Prior Publication Data
US 2023/0188157 A1 Jun. 15, 2023

(30) Foreign Application Priority Data
Dec. 9, 2021 (TW) ................................ 110146082

(51) Int. Cl.
*H03M 1/80* (2006.01)
*H03M 1/56* (2006.01)
*H03M 1/74* (2006.01)
*H03M 1/82* (2006.01)

(52) U.S. Cl.
CPC ............ *H03M 1/804* (2013.01); *H03M 1/56* (2013.01); *H03M 1/742* (2013.01); *H03M 1/825* (2013.01)

(58) Field of Classification Search
CPC ...... H03M 1/804; H03M 1/825; H03M 1/742; H03M 1/56
USPC .................................................. 341/144, 158
See application file for complete search history.

(56) References Cited

U.S. PATENT DOCUMENTS

| 10,498,992 | B2* | 12/2019 | Kim ....................... H04N 25/75 |
| 10,972,119 | B1* | 4/2021 | Fredenburg ........... H03M 1/687 |
| 2021/0099183 | A1 | 4/2021 | Lai |

OTHER PUBLICATIONS

1) OA letter of a counterpart TW application (appl. no. 110146082) mailed on Jul. 7, 2022. 2) Summary of the TW OA letter: 1. Claims 1-10 are rejected as allegedly being unpatentable over cited reference 1 (US 2021/0099183 A1). PS. Correspondence between claims of TW counterpart application and claims of US application: Claims 1-10 in TW counterpart application correspond to claims 1-10 in US application, respectively.

* cited by examiner

*Primary Examiner* — Khai M Nguyen
(74) *Attorney, Agent, or Firm* — WPAT, P.C

(57) ABSTRACT

A digital slope analog to digital converter includes a charge injection digital to analog converter (DAC) circuit, a comparator circuit, a detector circuit, and a control logic circuitry. The charge injection DAC circuit respectively samples input signals via first and second capacitors and generates a first signal via the first capacitor and a second signal via the second capacitor. The comparator circuit compares the first signal with the second signal to generate decision signals. The detector circuit generates a flag signal according to the decision signals. The control logic circuitry generates an enable signal according to the flag signal and generates a digital output when the comparator circuit detects a crossing point of the first and second signals. The charge injection DAC circuit gradually adjusts charges stored in the first and/or the second capacitor according to the enable signal until the crossing point is detected.

16 Claims, 5 Drawing Sheets

DIGITAL SLOPE ANALOG TO DIGITAL CONVERTER AND SIGNAL CONVERSION METHOD

BACKGROUND OF THE INVENTION

1. Field of the Invention

The present disclosure relates to an analog to digital converter, especially to a digital slope analog to digital converter and a signal conversion method that utilize a charge injection digital to analog converter circuit.

2. Description of Related Art

A digital slope analog to digital converter may utilize a ramp (or hierarchical) voltage change to generate a digital code. In existing digital slope analog to digital converters, a capacitor array circuit having multiple capacitors are employed to gradually adjust the signal level to generate the ramp voltage change. However, as mismatches may present between the capacitors, the analog to digital converter may have a poor linearity. In addition, a sufficient number of capacitors is required to produce the ramp voltage change. As a result, the circuit area and device cost are increased significantly.

SUMMARY OF THE INVENTION

In some aspects of the present disclosure, a digital slope analog to digital converter includes a charge injection digital to analog converter circuit, a comparator circuit, a detector circuit, and a control logic circuitry. The charge injection digital to analog converter circuit includes a first capacitor and a second capacitor and is configured to respectively sample a first input signal and a second input signal via the first capacitor and the second capacitor, and generate a first signal via the first capacitor and a second signal via the second capacitor. The comparator circuit is configured to compare the first signal with the second signal to generate a plurality of decision signals. The detector circuit is configured to generate a flag signal according to the plurality of decision signals. The control logic circuitry is configured to generate an enable signal according to the flag signal and generate a digital output when the comparator circuit detects a crossing point of the first signal and the second signal. The charge injection digital to analog converter circuit is further configured to gradually adjust charges stored in at least one of the first capacitor or the second capacitor according to the enable signal until the comparator circuit detects the crossing point.

In some aspects of the present disclosure, a signal conversion method includes the following operations: respectively sampling, by a first capacitor and a second capacitor, a first input signal and a second input signal, and generating a first signal via the first capacitor and a second signal via the second capacitor; comparing the first signal with the second signal to generate a plurality of decision signals; generating an enable signal according to the plurality of decision signals; gradually adjusting, by a charge injection digital to analog converter circuit, charges stored in at least one of the first capacitor or the second capacitor according to the enable signal until a crossing point of the first signal and the second signal is detected; and generating a digital output when the crossing point is detected.

These and other objectives of the present disclosure will no doubt become obvious to those of ordinary skill in the art after reading the following detailed description of the preferred embodiments that are illustrated in the various figures and drawings.

DETAILED DESCRIPTION OF THE PREFERRED EMBODIMENTS

The terms used in this specification generally have their ordinary meanings in the art and in the specific context where each term is used. The use of examples in this specification, including examples of any terms discussed herein, is illustrative only, and in no way limits the scope and meaning of the disclosure or of any exemplified term. Likewise, the present disclosure is not limited to various embodiments given in this specification.

In this document, the term "coupled" may also be termed as "electrically coupled," and the term "connected" may be termed as "electrically connected." "Coupled" and "connected" may mean "directly coupled" and "directly connected" respectively, or "indirectly coupled" and "indirectly connected" respectively. "Coupled" and "connected" may also be used to indicate that two or more elements cooperate or interact with each other. In this document, the term "circuitry" may indicate a system formed with one or more circuits, and the term "circuit" may indicate an object, which is formed with one or more transistors and/or one or more active/passive elements based on a specific arrangement, for processing signals.

As used herein, the term "and/or" includes any and all combinations of one or more of the associated listed items. Although the terms "first," "second," etc., may be used herein to describe various elements, these elements should not be limited by these terms. These terms are used to distinguish one element from another. For example, a first element could be termed a second element, and, similarly, a second element could be termed a first element, without departing from the scope of the embodiments. For ease of understanding, like elements in various figures are designated with the same reference number.

Figure 1:
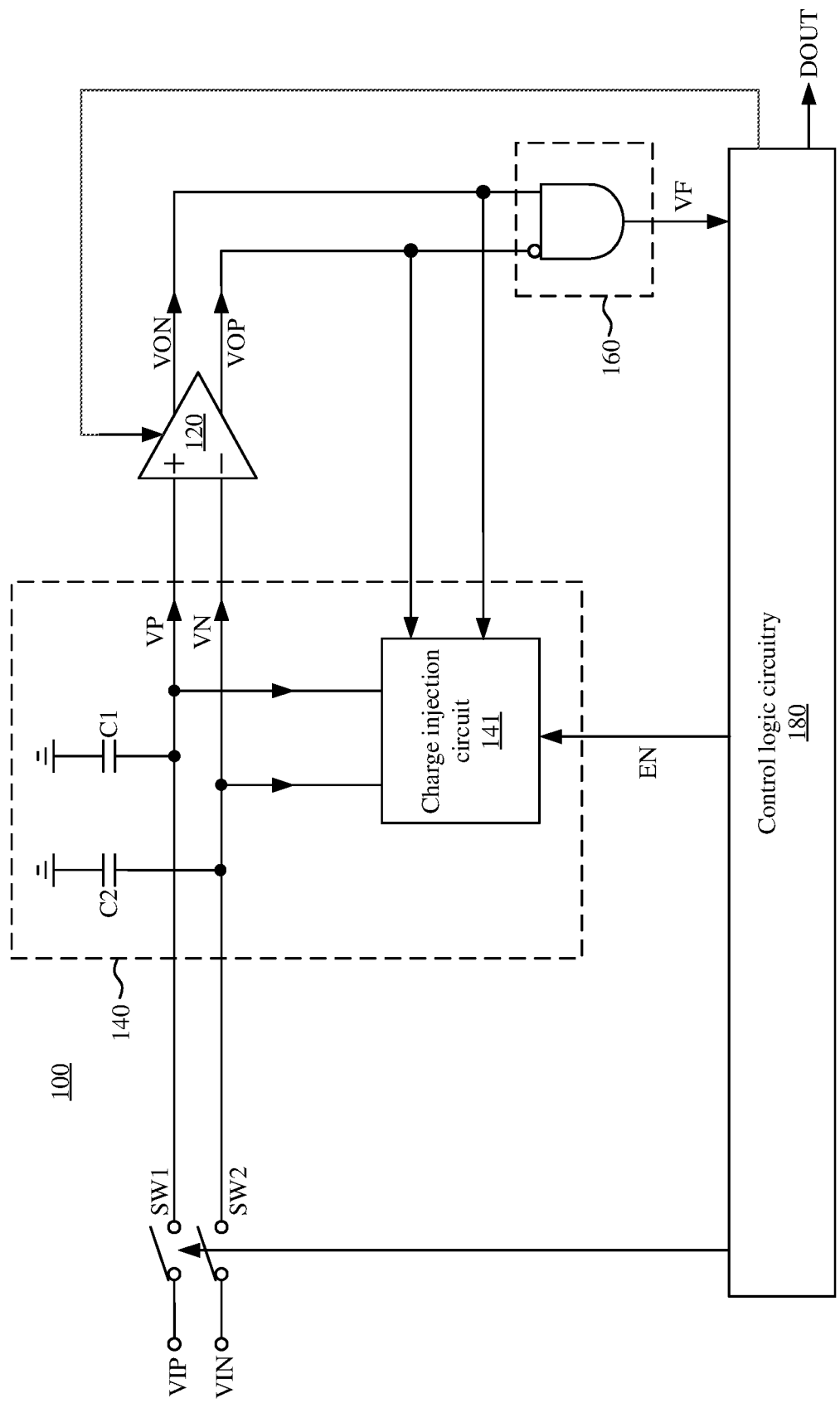
FIG. 1 illustrates a schematic diagram of a digital slope analog to digital converter according to some embodiments of the present disclosure.

FIG. 1 illustrates a schematic diagram of a digital slope analog to digital converter 100 according to some embodiments of the present disclosure. The digital slope analog to digital converter 100 includes a switch SW1, a switch SW2, a comparator circuit 120, a charge injection digital to analog converter circuit 140, a detector circuit 160, and a control logic circuitry 180.

Based on a control of the control logic circuitry 180, the switch SW1 and the switch SW2 are turned on during a sampling phase to transmit an input signal VIP and an input signal VIN to the charge injection digital to analog converter circuit 140. Based on the control logic circuitry 180, the switch SW1 and the switch SW2 are not turned on during an analog to digital conversion phase.

The charge injection digital to analog converter circuit 140 includes a capacitor C1, a capacitor C2, and a charge injection circuit 141. The charge injection digital to analog converter circuit 140 may sample the input signal VIP via the capacitor C1 and generate a signal VP via the capacitor C1. Similarly, the charge injection digital to analog converter circuit 140 may sample the input signal VIN via the capacitor C2 and generate a signal VN via the capacitor C2. During the analog to digital conversion phase, the comparator circuit 120 may compare the signal VP with the signal VN to generate a decision signal VON and a decision signal VOP. In response to the decision signal VON and the decision signal VOP, the detector circuit 160 may generate a flag signal VF, which may be configured to indicate a transition of the decision signal VON and the decision signal VOP. For example, the detector circuit 160 may be, but not limited to, an AND gate circuit having an inverting input terminal. The inverting input terminal receives the decision signal VOP, and another input terminal receives the decision signal VON. When the decision signal VON has a logic value of 1 and the decision signal VOP has a logic value of 0, the detector circuit 160 may generate the flag signal VF having the logic value of 1. When the decision signal VON has the logic value of 0 and the decision signal VOP has the logic value of 1, the detector circuit 160 may generate the flag signal VF having the logic value of 0.

The control logic circuitry 180 may generate an enable signal EN according to the flag signal VF, and generate a digital output DOUT when the comparator circuit 120 detects a crossing point of the signal VP and the signal VN. During a progress of the analog to digital conversion, the charge injection digital to analog converter circuit 140 may gradually adjust charges stored in at least one of the capacitor C1 or the capacitor C2 according to the enable signal EN, in order to adjust at least one corresponding one of the signal VP or the signal VN, until the comparator circuit 120 detects the crossing point of the signal VP and the signal VN. For example, the charge injection circuit 141 may gradually adjust at least corresponding one of the capacitor C1 or the capacitor C2 according to the enable signal EN until the decision signal VON and the decision signal VOP generated from the comparator circuit 120 transit (i.e., the flag signal VF transits). Operations of the comparator circuit 120 and the charge injection digital to analog converter circuit 140 will be described with reference to FIG. 2A and FIG. 2B.

In some embodiments, the control logic circuitry 180 may further control timings of the switch SW1, the switch SW2, the comparator circuit 120, and the charge injection digital to analog converter circuit 140. In some embodiments, the control logic circuitry 180 may include a clock generator circuit (not shown), a counter circuit (not shown), and an encoder circuit (not shown), in order to perform the above operations. Operations of the control logic circuitry 180 will be provided with reference to FIG. 3A.

Figure 2A:
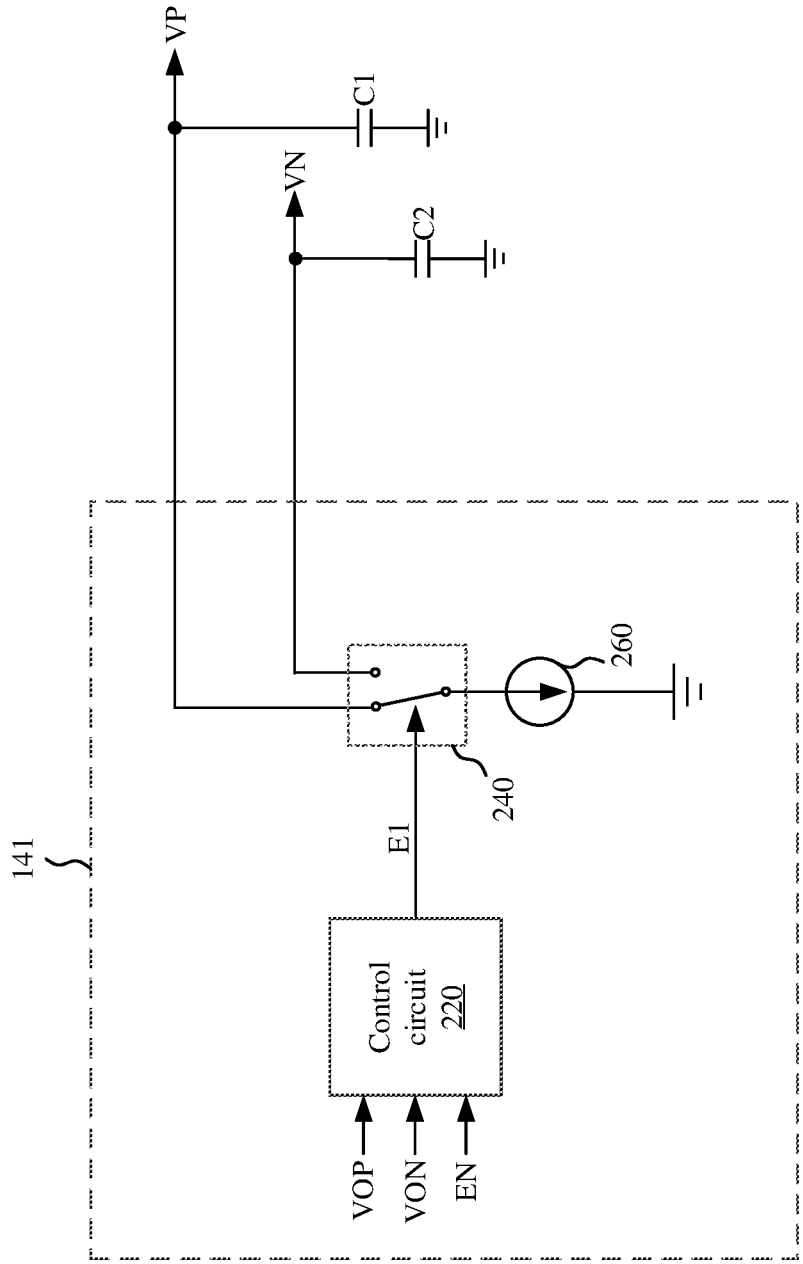
FIG. 2A illustrates a schematic diagram of the charge injection circuit in FIG. 1 according to some embodiments of the present disclosure.

FIG. 2A illustrates a schematic diagram of the charge injection circuit 141 in FIG. 1 according to some embodiments of the present disclosure. The charge injection circuit 141 may be configured to gradually adjust charges stored in at least one of the capacitor C1 or the capacitor C2 in FIG. 1 according to the enable signal EN, the decision signal VOP, and the decision signal VON. In this example, the charge injection circuit 141 includes a control circuit 220, a switching circuit 240, and a current source circuit 260.

The control circuit 220 is configured to generate a switching signal E1 according to the decision signal VON, the decision signal VOP, and the enable signal EN. The switching circuit 240 is selectively connected to the capacitor C1 or the capacitor C2 according to the switching signal E1. In some embodiments, the switching circuit 240 may include switches, which are configured to be turned on respectively according to control bits (not shown) of the switching signal E1, in order to connect the current source circuit 260 to the capacitor C1 or the capacitor C2. As a result, the current source circuit 260 may discharge the capacitor C1 or the capacitor C2 via the switching circuit 240. Equivalently, during an interval (e.g., time length tin FIG. 2B) where the switching circuit 240 is turned on, charge(s) of the capacitor C1 (or the capacitor C2) may be injected into the current source circuit 260, in order to gradually adjust (e.g., lower) the level of the signal VP (or the signal VN).

In some embodiments, the control circuit 220 may be implemented with logic gate circuit(s) and register circuit(s), in order to generate the control bits of the switching signal E1. The register circuit may be configured to store the decision signal VON and the decision signal VOP that correspond to a first (or initial) comparison result generated by the comparator circuit 120 during the analog to digital conversion phase. According to the decision signal VON and the decision signal VOP that correspond to the first comparison result, the switching circuit 240 may determine whether to connect the current source circuit 260 to the capacitor C1 or the capacitor C2. For example, the comparator circuit 120 is reset before starting to perform comparison, such that both of the decision signal VOP and the decision signal VON have the same reset levels (e.g., a low level corresponding to a logic value of 0 or a high level corresponding to a logic value of 1). If in the first comparison this is performed after the sampling phase, the comparator circuit 120 determines that the level of the signal VP is higher than the level of the signal VN, the comparator circuit 120 outputs the decision signal VON having a first logic value (a logic value of 1) and the decision signal VOP having a second logic value (e.g., a logic value of 0) (which equals to the first comparison result). In response to the decision signal VON and the decision signal VOP, the switching circuit 240 may connect the current source circuit 260 to the capacitor C1 according to the switching signal E1, in order to gradually discharge the capacitor C1. In other words, the charge injection circuit 141 may discharge the one having higher level of the capacitor C1 and the capacitor C2 according to the decision signal VON and the decision signal VOP corresponding to the first comparison result, in order to detect the crossing point of the signal VP and the signal VN. Furthermore, the charge injection circuit 141 may determine a turn-on interval of the switching circuit 240 (i.e., the time of the current source circuit 260 discharging the capacitor C1 or the capacitor C2, which may be, for example, time length tin FIG. 2B) according to the enable signal EN.

Figure 2B:
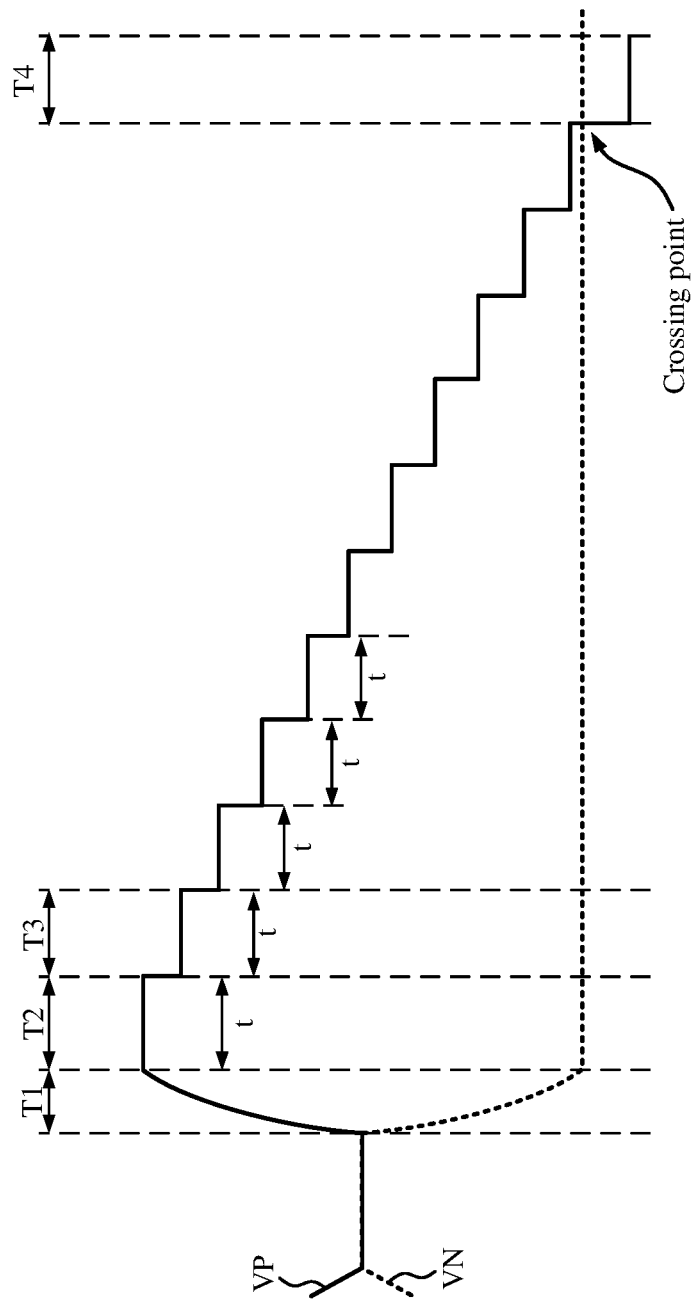
FIG. 2B illustrates a waveform diagram of multiple signals in FIG. 1 according to some embodiments of the present disclosure.

FIG. 2B illustrates a waveform diagram of the signal VP and the signal VN in FIG. 1 according to some embodiments of the present disclosure. During a phase T1 (i.e., sampling phase), the switch SW1 and the switch SW2 are turned on. Under this condition, the capacitor C1 may sample the input signal VIP so that the level of the signal VP (i.e., the level of the capacitor C1) is higher, and the capacitor C2 may sample the input signal VIN so that the level of the signal VN (i.e., the level of the capacitor C2) is lower.

During a phase T2, the analog to digital conversion is started, and thus the switch SW1 and the switch SW2 are not turned on. The comparator circuit 120 compares the signal VP with the signal VN, and determines that the signal VP is higher than the signal VN and thus outputs the decision signal VON having the logic value of 0 and the decision signal VOP having the logic value of 1. In other words, in this example, the first (i.e., initial) comparison result, which is obtained after the input signal VIP and the input signal VIN are sampled, indicates that the level of the signal VP is higher than that of the signal VN. Under this condition, the detector circuit 160 outputs the flag signal VF having the logic value of 1, and the charge injection digital to analog converter circuit 140 may gradually discharge the capacitor C1 according to the decision signal VOP and the decision signal VON.

During a phase T3, the charge injection digital to analog converter circuit 140 discharges the capacitor C1, in order to lower the level of the signal VP. The comparator circuit 120 then compares the signal VP with the signal VN again, determines that the signal VP is still higher than the signal VN, and outputs the decision signal VON having the logic value of 1 and the decision signal VOP having the logic value of 0. As a result, the detector circuit 160 outputs the flag signal VF having the logic value of 1 again. With this analogy, the charge injection digital to analog converter circuit 140 may gradually lower the level of the signal VP during the following phases until the level of the signal VP is lower than that of the signal VN, in which each phase corresponds to a time length t. For example, during a last phase T4, the charge injection digital to analog converter circuit 140 discharges the capacitor C1 to lower the level of the signal VP. The comparator circuit 120 then compares the signal VP with the signal VN and determines that the signal VP is lower than the signal VN to output the decision signal VON having the logic value of 0 and the decision signal VOP having the logic value of 1. Under this condition, the detector circuit 160 generates the flag signal VF having the logic value of 0, in order to indicate that the comparator circuit 120 detects the crossing point of the signal VP and the signal VN. The control logic circuitry 180 may generate the corresponding digital output DOUT according to the flag signals VF generated in the above progress, and finish performing the analog to digital conversion accordingly.

Figure 3A:
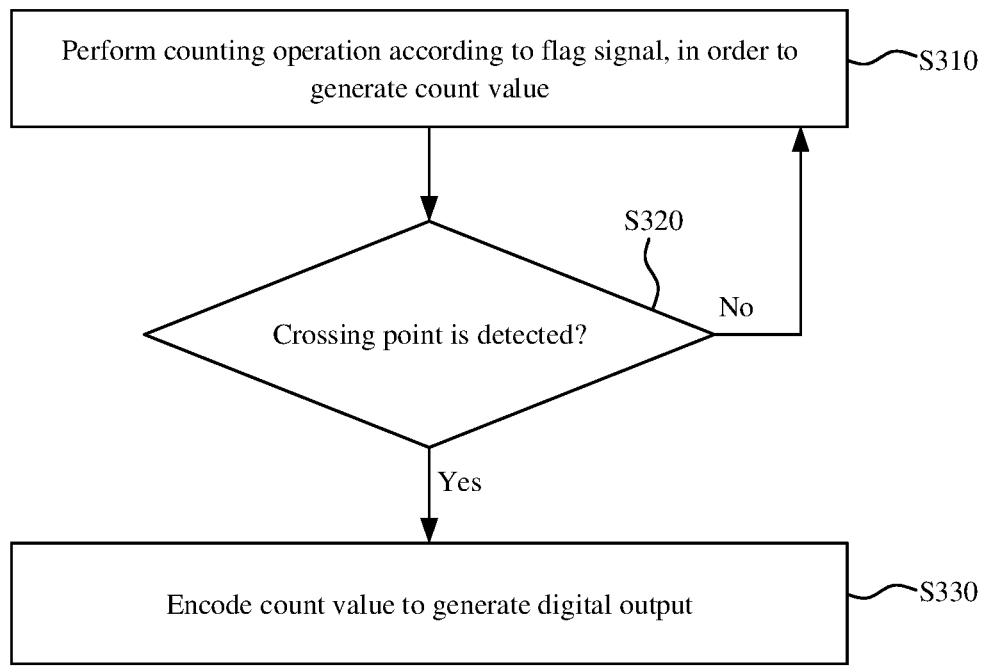
FIG. 3A illustrates a flow chart of the control logic circuitry in FIG. 1 generating the digital output according to some embodiments of the present disclosure.
Figure 3B:
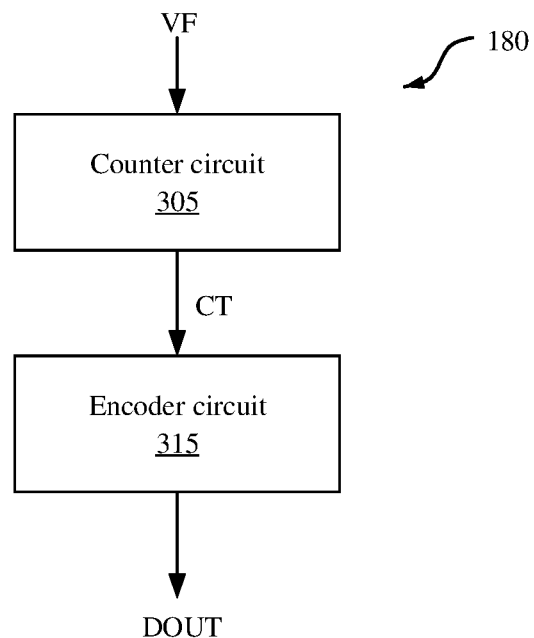
FIG. 3B illustrates a schematic diagram of partial circuits in the control logic circuitry in FIG. 1 according to some embodiments of the present disclosure.

FIG. 3A illustrates a flow chart of the control logic circuitry 180 in FIG. 1 generating the digital output DOUT according to some embodiments of the present disclosure. FIG. 3B illustrates a schematic diagram of partial circuits in the control logic circuitry 180 in FIG. 1 according to some embodiments of the present disclosure. In order to illustrate operations of the control logic circuitry 180 generating the digital output DOUT, reference is made to FIG. 3A and FIG. 3B. For ease of illustration, FIG. 3B only shows circuit portions that are mainly associated with the generation of the digital output DOUT in the control logic circuitry 180. In some embodiments, the control logic circuitry 180 includes a counter circuit 305 and an encoder 315, which may be configured to perform operations in FIG. 3A to generate the digital output DOUT.

In operation S310, a counting operation is performed according to a flag signal, in order to generate a count value. In operation S320, whether the comparator circuit detects the crossing point is determined. If the comparator circuit detects the crossing point, operation S330 is performed. If the comparator circuit does not detect the crossing point, operation S310 is performed again. In operation S330, the count value is encoded to generate a digital output.

For example, the counter circuit 350 is configured be reset during the sampling phase (e.g., phase T1 in FIG. 2B), and be triggered to start counting according to the flag signal VF after the sampling phase, in order to generate a count value CT. In view of examples shown in FIG. 2B, during the phase T2, the flag signal VF has the logic value of 1. In response to the flag signal VF, the counter circuit 305 may increase the count value CT by one unit (e.g., the count value is increased from 0 to +1). During the phase T3, the flag signal VF still has the logic value of 1. In response to the flag signal VF, the counter circuit 305 may increase the count value by one unit again (e.g., the count value is increased from +1 to +2). With this analogy, during the last phase T4, the flag signal VF transits to have the logic value of 0. In response to the flag signal VF, the counter circuit 305 stops increasing the count value CT, and outputs the current count value to the encoder circuit 315. The encoder circuit 315 may encode the count value CT, in order to generate the digital output DOUT. In other words, with operation S310 to operation S330, the control logic circuitry 180 may perform the counting operation according to the flag signal VF until the comparator circuit 120 detects the crossing point, in order to generate the count value CT and encode the count value CT to generate the digital output DOUT.

The above operations of generating the digital output DOUT and the above arrangements of the control logic circuitry 180 are given for illustrative purposes, and the present disclosure is not limited thereto. Various operations to generate the digital output DOUT and the corresponding circuit arrangements are within the contemplated scope of the present disclosure.

In some related approaches, the digital slope analog to digital converter utilizes a capacitor array having multiple capacitor to generate a ramp voltage change. In these approaches, mismatches may present among the capacitors, and thus a linearity of the analog to digital converter using that capacitor array is lower. Moreover, the capacitor array is required to utilize multiple capacitors to gradually adjust the level, which leads to higher circuit area. In the above embodiments, the number of the current source circuit (e.g., the current source circuit 260) that is configured to adjust the capacitors C1 and C2 in the charge injection digital to analog converter circuit 140 is 1. As a result, it is able to avoid mismatch of the charge injection digital to analog converter circuit 140 and reduce circuit area effectively. In addition, as operations of the charge injection digital to analog converter circuit 140 are performed by injecting charges in sequence at different phases, such operation characteristic meets operation requirements of the digital slope analog to digital converter 100 to gradually adjust the signal level to detect the crossing point.

In the above embodiments, one of the capacitor C1 and the capacitor C2 is adjusted to detect the crossing point, but the present disclosure is not limited thereto. In other embodiments, both of the capacitor C1 and the capacitor C2 are adjusted to detect the crossing point. For example, the charge injection digital to analog converter circuit 140 may have an additional charge injection circuit, which is configured to charge another one of the capacitor C1 and the capacitor C2 (i.e., inject charges to another one of the capacitor C1 and the capacitor C2). In view of examples in FIG. 2B, as the first comparison result indicates that the level of the signal VN is lower, the additional charge injection circuit may gradually charge the capacitor C2, in order to gradually increase the level of the signal VN. As a result, the crossing point of the signal VP and the signal VN can be detected faster. In other words, in some embodiments, the charge injection digital to analog converter circuit 140 may include multiple charge injection circuits 141, one charge injection circuit 141 is configured to discharge one of the capacitors C1 and C2 (e.g., the one having higher level), and one charge injection circuit 141 is configured to charge one of the capacitors C1 and C2 (e.g., the one having lower level).

Alternatively, in some other embodiments, the charge injection digital to analog converter circuit 140 may utilize the same charge injection circuit (e.g., the charge injection circuit 141) to alternately discharge one of the capacitor C1 and the capacitor C2 and discharge another one of the capacitor C1 and the capacitor C2. In view of examples in FIG. 2B, during the phase T2, the current source circuit 260 may discharge the capacitor C1 via the switching circuit 240. During the phase T3, the current source circuit 260 may charge the capacitor C2 via additional switches (not shown in FIG. 2A) in the switching circuit 240. With this analogy, the crossing point of the signal VP and the signal VN can be detected. Therefore, in different embodiments, the charge injection digital to analog converter circuit 140 may gradually adjust charges stored in at least one of the capacitor C1 or the capacitor C2 to adjust the level of at least corresponding one of the signal VN or the signal VP, until the comparator circuit 120 detects the crossing point.

The arrangements about the charge injection digital to analog converter circuit 140 are given for illustrative purposes, and the present disclosure is not limited thereto. Various circuit arrangements able to gradually adjust the level of at least one of the capacitor C1 or the capacitor C2 are within contemplated scope of the present disclosure.

Figure 4:
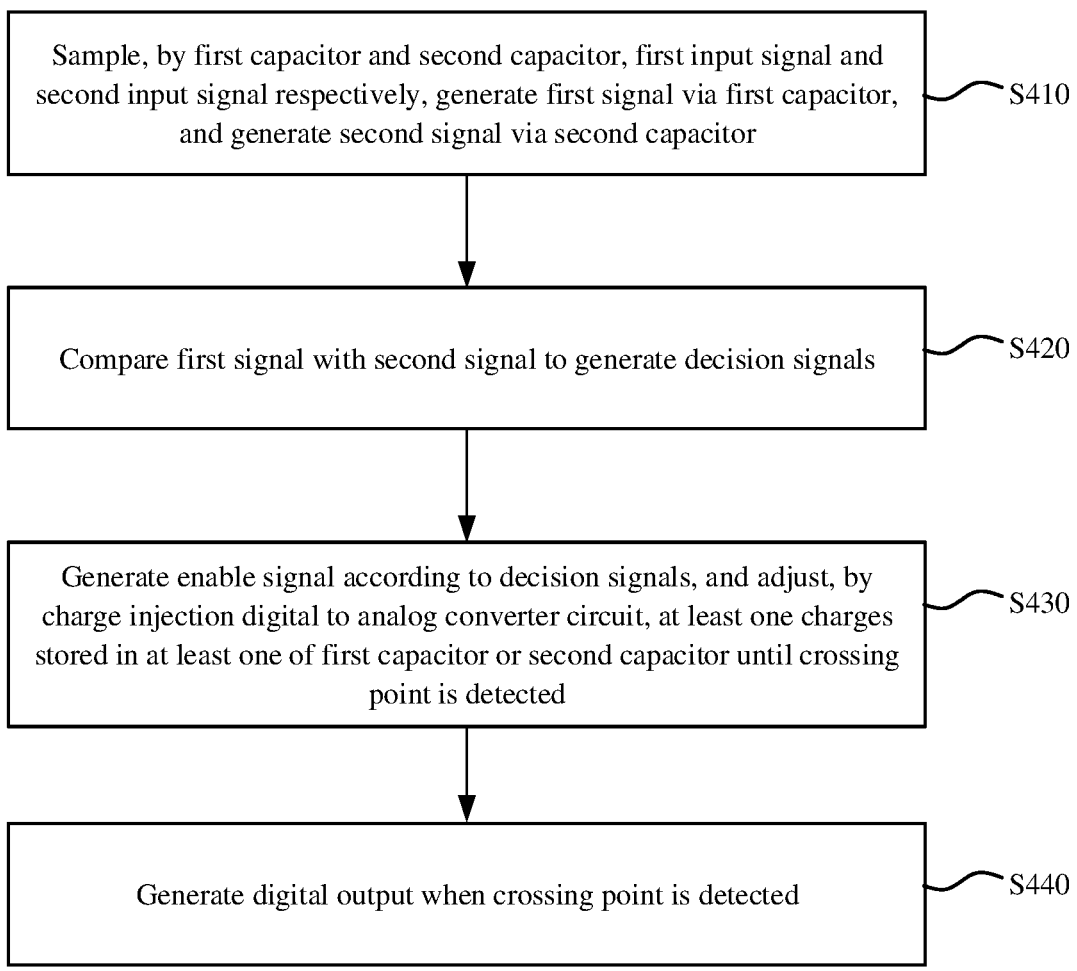
FIG. 4 illustrates a flow chart of a signal conversion method according to some embodiments of the present disclosure.

FIG. 4 illustrates a flow chart of a signal conversion method 400 according to some embodiments of the present disclosure. In operation S410, a first input signal (e.g., the input signal VIP) and a second input signal (e.g., the input signal VIN) are respectively sampled by a first capacitor (e.g., the capacitor C1) and a second capacitor (e.g., the capacitor C2), a first signal (e.g., the signal VP) is generated via the first capacitor and a second signal (e.g., the signal VN) is generated via the second capacitor. In operation S420, the first signal and the second signal are compared with each other to generate decision signals (e.g., the decision signal VON and the decision signal VOP). In operation S430, a enable signal (the enable signal EN) is generated according to the decision signals, and charges stored in at least one of the first capacitor or the second capacitor are gradually adjusted by a charge injection digital to analog converter circuit (e.g., the charge injection digital to analog converter circuit 140) until a crossing point of the first signal and the second signal is detected. In operation S440, a digital output is generated when the crossing point is detected.

The above operations can be understood with reference to the aforementioned embodiments, and thus the repetitious descriptions are not further given. The above description of the signal conversion method 400 includes exemplary operations, but the operations of the signal conversion method 400 are not necessarily performed in the order described above. Operations of the signal conversion method 400 can be added, replaced, changed order, and/or eliminated, or the operations of the signal conversion method 400 can be executed simultaneously or partially simultaneously as appropriate, in accordance with the spirit and scope of various embodiments of the present disclosure.

As described above, the digital slop analog to digital converter and the signal conversion method provided in some embodiments of the present disclosure may utilize charge injection circuit(s) to gradually adjust the signal level to generate a ramp voltage change. As a result, the impacts of mismatches can be reduced, and the number of required circuits can be reduced to save the circuit area.

Various functional components or blocks have been described herein. As will be appreciated by persons skilled in the art, in some embodiments, the functional blocks will preferably be implemented through circuits (either dedicated circuits, or general purpose circuits, which operate under the control of one or more processors and coded instructions), which will typically comprise transistors or other circuit elements that are configured in such a way as to control the operation of the circuitry in accordance with the functions and operations described herein. As will be further appreciated, the specific structure or interconnections of the circuit elements will typically be determined by a compiler, such as a register transfer language (RTL) compiler. RTL compilers operate upon scripts that closely resemble assembly language code, to compile the script into a form that is used for the layout or fabrication of the ultimate circuitry. Indeed, RTL is well known for its role and use in the facilitation of the design process of electronic and digital systems.

The aforementioned descriptions represent merely the preferred embodiments of the present disclosure, without any intention to limit the scope of the present disclosure thereto. Various equivalent changes, alterations, or modifications based on the claims of the present disclosure are all consequently viewed as being embraced by the scope of the present disclosure.

What is claimed is:

1. A digital slope analog to digital converter, comprising:
a charge injection digital to analog converter circuit comprising a first capacitor and a second capacitor, the charge injection digital to analog converter circuit configured to respectively sample a first input signal and a second input signal via the first capacitor and the second capacitor, and generate a first signal via the first capacitor and a second signal via the second capacitor;
a comparator circuit configured to compare the first signal with the second signal to generate a plurality of decision signals;
a detector circuit configured to generate a flag signal according to the plurality of decision signals; and
a control logic circuitry configured to generate an enable signal according to the flag signal, and generate a digital output when the comparator circuit detects a crossing point of the first signal and the second signal,
wherein the charge injection digital to analog converter circuit is further configured to gradually adjust charges stored in at least one of the first capacitor or the second capacitor according to the enable signal until the comparator circuit detects the crossing point.

2. The digital slope analog to digital converter of claim 1, wherein the charge injection digital to analog converter circuit is configured to determine whether to adjust the charges stored in the first capacitor or the second capacitor according to the plurality of decision signals corresponding to an initial comparison result of the first signal and the second signal.

3. The digital slope analog to digital converter of claim 1, wherein if an initial comparison result that is performed after the first input signal and the second input signal are sampled indicates that a level of the first input is higher than a level of the second signal, the charge injection digital to analog converter circuit is configured to gradually discharge the first capacitor according to the plurality of decision signals.

4. The digital slope analog to digital converter of claim 1, wherein the control logic circuitry is configured to perform a co-uniting operation according to the flag signal until the comparator circuit detects the crossing point to generate a count value, and encode the count value to generate the digital output.

5. The digital slope analog to digital converter of claim 1, wherein the charge injection digital to analog converter circuit further comprises:
   a charge injection circuit configured to gradually adjust the charges stored in the at least one of the first capacitor or the second capacitor according to the enable signal and the plurality of decision signals.

6. The digital slope analog to digital converter of claim 5, wherein the charge injection circuit comprises:
   a control circuit configured to generate a switching signal according to the enable signal and the plurality of decision signals;
   a switching circuit configured to be selectively connected to the first capacitor or the second capacitor according to the switching signal; and
   a current source circuit configured to discharge the first capacitor or the second capacitor via the switching circuit.

7. The digital slope analog to digital converter of claim 1, wherein a number of a current source circuit for adjusting the first capacitor or the second capacitor in the charge injection digital to analog converter circuit is 1.

8. The digital slope analog to digital converter of claim 1, wherein the charge injection digital to analog converter circuit further comprises:
   a plurality of charge injection circuits configured to discharge one of the first capacitor and the second capacitor and charge another one of the first capacitor and the second capacitor according to the enable signal and the plurality of decision signals.

9. A signal conversion method, comprising:
   respectively sampling, by a first capacitor and a second capacitor, a first input signal and a second input signal, and generating a first signal via the first capacitor and a second signal via the second capacitor;
   comparing the first signal with the second signal to generate a plurality of decision signals;
   generating an enable signal according to the plurality of decision signals;
   gradually adjusting, by a charge injection digital to analog converter circuit, charges stored in at least one of the first capacitor or the second capacitor according to the enable signal until a crossing point of the first signal and the second signal is detected; and
   generating a digital output when the crossing point is detected.

10. The signal conversion method of claim 9, wherein gradually adjusting, by the charge injection digital to analog converter circuit, the charges stored in at least one of the first capacitor or the second capacitor according to the enable signal until the crossing point of the first signal and the second signal is detected comprises:
   determining whether to adjust the charges stored in the first capacitor or the second capacitor according to the plurality of decision signals corresponding to an initial comparison result of the first signal and the second signal.

11. The signal conversion method of claim 9, wherein a number of a current source circuit for adjusting the first capacitor or the second capacitor in the charge injection digital to analog converter circuit is 1.

12. The signal conversion method of claim 9, wherein gradually adjusting, by the charge injection digital to analog converter circuit, the charges stored in at least one of the first capacitor or the second capacitor according to the enable signal until the crossing point of the first signal and the second signal is detected comprises:
   if an initial comparison result that is performed after the first input signal and the second input signal are sampled indicates that a level of the first input is higher than a level of the second signal, gradually discharging, by the charge injection digital to analog converter circuit, the first capacitor according to the plurality of decision signals.

13. The signal conversion method of claim 9, wherein generating the enable signal according to the plurality of decision signals;
   generating a flag signal according to the plurality of decision signals; and
   generating the enable signal according to the flag signal.

14. The signal conversion method of claim 13, wherein generating the digital output when the crossing point is detected comprises:
   performing a counting operation according to the flag signal until the crossing point is detected, in order to generate a count value; and
   encoding the count value to generate the digital output.

15. The signal conversion method of claim 9, wherein gradually adjusting, by the charge injection digital to analog converter circuit, the charges stored in at least one of the first capacitor or the second capacitor according to the enable signal until the crossing point of the first signal and the second signal is detected comprises:
   generating, by a control circuit of the charge injection digital to analog converter circuit, a switching signal according to the enable signal and the plurality of decision signals;
   selectively connecting a switching circuit of the charge injection digital to analog converter circuit to the first capacitor or the second capacitor according to the switching signal; and
   discharging, by a current source of the charge injection digital to analog converter circuit, the first capacitor or the second capacitor via the switching circuit.

16. The signal conversion method of claim 9, wherein gradually adjusting, by the charge injection digital to analog converter circuit, the charges stored in at least one of the first capacitor or the second capacitor according to the enable signal until the crossing point of the first signal and the second signal is detected comprises:
   discharging, by a first charge injection circuit in the charge injection digital to analog converter circuit, one of the first capacitor and the second capacitor; and
   charging, by a second charge injection circuit in the charge injection digital to analog converter circuit, another one of the first capacitor and the second capacitor according to the enable signal and the plurality of decision signals.

* * * * *